United States Patent [19]

Jaffe

[11] 3,778,643

[45] Dec. 11, 1973

[54] A SOLID STATE VARIABLE DELAY LINE USING REVERSED BIASED PN JUNCTIONS

[75] Inventor: James M. Jaffe, Southfield, Mich.

[73] Assignee: General Motors Corporation, Detroit, Mich.

[22] Filed: May 18, 1972

[21] Appl. No.: 254,613

[52] U.S. Cl. .............................. 307/293, 333/31 R
[51] Int. Cl. ......................... H03k 17/26, H03h 7/30
[58] Field of Search ............................ 307/299, 293; 328/55, 56; 333/31 R, 81 A, 84 M

[56] References Cited

UNITED STATES PATENTS

| | | | |
|---|---|---|---|
| 3,432,778 | 3/1969 | Ertel | 333/81 |
| 3,560,891 | 2/1971 | MacLeay et al. | 333/31 R |
| 3,399,361 | 8/1968 | Belson | 333/31 R |
| 3,644,850 | 2/1972 | Ho | 333/31 R X |

*Primary Examiner*—Stanley D. Miller, Jr.
*Attorney*—C. R. Meland et al.

[57] ABSTRACT

An electronically variable delay line including a wafer of silicon on one side of which a thin insulating layer is deposited. A highly conducting ground plane contacts the silicon wafer on its remaining side while a highly conducting microstrip line contacts the insulating layer. The microstrip line contacts the silicon wafer through small holes etched in the insulating layer at predetermined intervals. At these holes, P-N junctions are formed. The P-N junctions are reverse biased so as to vary the effective thickness of the insulating layer to vary the delay time by creating a depletion layer within the silicon wafer which acts as an effective insulator.

2 Claims, 2 Drawing Figures

PATENTED DEC 11 1973 3,778,643

A SOLID STATE VARIABLE DELAY LINE USING REVERSED BIASED PN JUNCTIONS

This invention relates to a variable delay line. More specifically, the invention relates to an electronically variable delay line capable of large delay ratios in the UHF region.

The form of propagation in a delay line of the type to which this invention is directed is via a slow mode. i.e., the velocity of propagation is much lower than the velocity of light. A slow mode can be generated in various ways. The dielectric permittivity or permeability can be large, or the geometry of the device can be made such that the electric and magnetic fields are stored independently. The comb line, ladder line, and helical delay lines are all forms of independent energy storage devices. It is to this type of slow mode line to which this invention is directed. One such line consists of two layers, one lossy and the other a good insulator, bounded by two highly conducting lines. Qualitatively, the slow mode is generated by storing electric field energy in the insulator and storing magnetic field energy in the lossy medium. It is the general object of this invention to provide a delay line of this nature in which the delay time is electronically varied.

Another object of this invention is to provide an electronically variable delay line having large delay ratios.

Another object of this invention is to provide an electronically variable delay line by varying the depletion layer within a semiconductor surface which acts as an effective insulator in an energy splitting type slow mode delay line.

Figure 1:
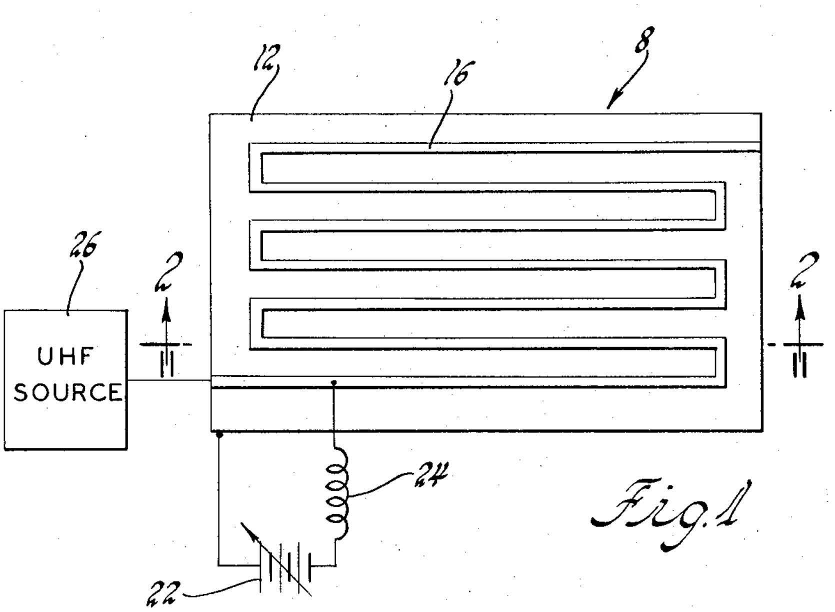
Figure 2:
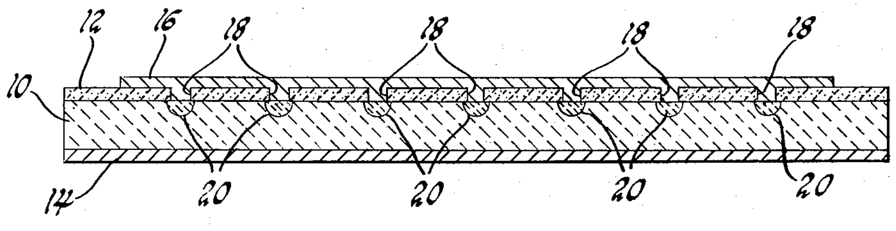

The objects of this invention may be best understood by reference to the following description of a preferred embodiment and the figures in which:

FIG. 1 is a schematic drawing of the delay line illustrating the preferred embodiment of this invention; and FIG. 2 is a cross-section of the delay line as viewed along lines 2—2 of FIG. 1.

Referring to the figures, the electronically variable delay line 8 includes a wafer of silicon 10 upon which an insulating layer 12, such as silicon dioxide, is deposited. A highly conductive ground plane 14 contacts the silicon wafer 10 on the side opposite the insulating layer 12 while a highly conductive microstrip line 16 is placed on the insulating layer 12. What has thus far been described is a known UHF delay line of the form previously described having a constant time delay. In order to provide for a variable delay, the conductive microstrip line 16 contacts the silicon wafer 10 through small holes 18 spaced in the insulating layer 12 throughout the length of the microstrip line 16. At these holes 18, the silicon wafer 10, which may be basically comprised of either a P or N type material, is converted, such as by gaseous diffusion, to the opposite conductivity type so as to form P-N junctions 20. For purposes of illustration, it will be assumed that the silicon wafer 10 is composed of N type material which, by gaseous diffusion, is changed to P type material at each of the holes 18. These P-N junctions are reverse biased by means of a variable voltage source 22 which is series connected with an RF choke 24, the positive terminal of the variable voltage source 22 being connected to the ground plane 14 and the choke being connected to the microstrip line 16. A UHF source 26 supplies a UHF signal to the delay line 8. By varying the magnitude of the output voltage of the variable voltage source 22, the delay line 8 is made variable as will hereinafter be shown.

If the P-N junctions 20 are eliminated from the line, a slow mode will propagate with a propagation constant given by (1)

$$\frac{\gamma}{k_o}=j\sqrt{\mu 2\,\epsilon 2}\left(1+\frac{\mu_1 l_1}{\mu_2 l_2}\right)^{1/2}\left[\left(1-j\,\frac{\omega}{2}\,\frac{\epsilon_0\epsilon_2 l_1}{l_2\sigma_1}+\frac{1}{3}\,\frac{\mu_0\mu_1^2 l_1^3\sigma_1}{3\mu_1 l_1+\mu_2 l_2}\right)\right]$$

where $\mu_1\mu_2$ are the relative permeabilities of the silicon wafer 10 and the insulating layer 12, respectively, $\epsilon_2$ is the relative dielectric constant of the insulating layer 12, $l_1 l_2$ are the thicknesses of the silicon wafer 10 and the insulating layer 12, $\sigma_1$ is the conductivity of the silicon wafer 10, $\omega$ is the radian frequency of the output signal of the UHF source 26, $\gamma$ is the complex propagation constant, $k_o$ is the propagation constant in vacuum, $\mu_0$ is the permeability constant in vacuum, and $\epsilon_0$ is the permittivity constant in vacuum.

This slow mode will propagate up to a critical frequency $\omega_c$ given approximately by (2)

$$\omega_c=\frac{\sqrt{3}}{\frac{\epsilon_0\epsilon_2}{l_2}\,\frac{l_1}{\sigma_1}+\frac{1}{3}\,\frac{\mu_0(\mu_1 l_1)^2\sigma_1 l_1}{\mu_1 l_1+\mu_2 l_2}}$$

If the silicon wafer 10 is thick compared to the insulating layer 12, the propagation velocity $V_p$ will be approximately (3)

$$V_p=\frac{c}{\left(\frac{\mu_1 l_1}{\mu_2 l_2}\right)^{1/2}}$$

The attenuation will be small at frequencies much lower than the critical frequency $W_c$. This makes the line nearly dispersionless.

Assuming now that the P-N junctions 20 are introduced and that they are reverse biased, as previously described, by means of the variable voltage source 22. A depletion layer of very low conductivity will be formed in the silicon wafer 10. It can be shown that this depletion layer and the insulating layer 12 acts as an effective insulator section with dielectric constant $\epsilon_e$ given by (4) $\epsilon_e = [\epsilon_1\,\epsilon_2\,(l_2 + l_3)\,/\epsilon_1\,l_2 + \epsilon_2\,l_3]$ and the effective length $l_e$ given by (5) $l_e = l_2 + l_3$ where $\epsilon_1$ is the silicon dielectric constant and $l_3$ is the depletion layer thickness.

The depletion layer width $l_3$ is a function of the magnitude of the voltage supplied by the variable voltage source 22. Consequently, $l_e$ and $\epsilon_e$ can be changed by varying the magnitude of the bias voltage between the microstrip line 16 and the ground plane 14 and thereby varying the delay time of the variable delay line 8.

Although in the embodiment described, the silicon wafer 10 was composed of N type material which was converted at the holes 18 into P type material by gaseous diffusion to form the P-N junctions 20, the silicon wafer 10 could be of N type material which is converted at the holes 18 into P type material. The polarity of the variable voltage source 22 would then be reversed. Also, it is to be noted that the insulating layer 12 could be eliminated with the depletion layer forming the total effective insulator thickness which is variable as a function of the magnitude of the variable voltage source 22. What has been described is a variable delay line in which the effective insulator thickness of a two layer semiconductor slow mode line is varied electronically to vary the delay time of the line.

The detailed description of the preferred embodiment of the invention for the purpose of explaining the principles thereof is not to be considered as limiting or restricting the invention, since many modifications may be made by the exercise of skill in the art without departing from the scope of the invention.

I claim:

1. An electronically variable delay line comprising a semiconductor body; a conducting ground plane contacting the semiconductor on one side thereof; an insulator contacting the semiconductor body on another side thereof; a transmission line conductor carried by the insulator, said insulator having openings therein which are spaced along and under the transmission line conductor so that the transmission line conductor contacts the semiconductor body through said insulator, the portions of the semiconductor body contacted by the transmission line conductor being of one conductivity type with the remaining portion of the semiconductor body being of the opposite conductivity type, said portions combining to form a plurality of diode junctions; and variable bias voltage means coupled to the conducting ground plane and the transmission line conductor and poled to reverse bias the diode junctions to form a depletion layer within the semiconductor body which combines with the insulator to form an effective insulator having a width which varies as the function of the magnitude of the bias voltage to thereby vary the delay time of the variable delay line.

2. An electronically variable delay line system comprising: a variable delay line including a semiconductor body having a first portion composed of one conductivity type and a second portion composed of the opposite conductivity type, the first and second portions combining to form a diode junction, a conducting ground plane contacting the first portion of the semiconductor body, a transmission line conductor contacting the second portion of the semiconductor body and variable bias voltage means coupled to the conducting ground plane and the transmission line conductor and poled to reverse bias the diode junction to form a depletion layer having a variable thickness; a signal generator for generating a signal having a frequency less than a critical frequency below which the variable delay line becomes dispersionless; and means coupling the signal to the variable delay line whereby the signal is delayed by the variable delay line for a time duration determined by the reverse bias on the diode junction.

* * * * *